United States Patent
Li et al.

(10) Patent No.: US 9,458,415 B2
(45) Date of Patent: Oct. 4, 2016

(54) POST CHEMICAL-MECHANICAL-POLISHING (POST-CMP) CLEANING COMPOSITION COMPRISING A SPECIFIC SULFUR-CONTAINING COMPOUND AND A SUGAR ALCOHOL OR A POLYCARBOXYLIC ACID

(71) Applicant: BASF SE, Ludwigshafen (DE)

(72) Inventors: Yuzhuo Li; Shyam Sundar Venkataraman, Ludwigshafen (DE); Mingjie Zhong, Potsdam, NY (US)

(73) Assignee: BASF SE, Ludwigshafen (DE)

( * ) Notice: Subject to any disclaimer, the term of this patent is extended or adjusted under 35 U.S.C. 154(b) by 118 days.

(21) Appl. No.: 14/376,978

(22) PCT Filed: Jan. 24, 2013

(86) PCT No.: PCT/IB2013/050625
§ 371 (c)(1),
(2) Date: Aug. 6, 2014

(87) PCT Pub. No.: WO2013/118013
PCT Pub. Date: Aug. 15, 2013

(65) Prior Publication Data
US 2015/0018261 A1 Jan. 15, 2015

Related U.S. Application Data

(60) Provisional application No. 61/595,180, filed on Feb. 6, 2012.

(51) Int. Cl.
*C11D 7/34* (2006.01)
*C11D 3/34* (2006.01)
(Continued)

(52) U.S. Cl.
CPC ........... *C11D 3/3427* (2013.01); *C11D 3/2065* (2013.01); *C11D 3/349* (2013.01);
(Continued)

(58) Field of Classification Search
CPC .................................................. C11D 11/0047
See application file for complete search history.

(56) References Cited

U.S. PATENT DOCUMENTS

| 7,087,562 B2 | 8/2006 | Abe et al. |
| 7,922,823 B2 | 4/2011 | Walker et al. |

(Continued)

FOREIGN PATENT DOCUMENTS

| CN | 101685272 A | 3/2010 |
| CN | 101942667 A | 1/2011 |

(Continued)

OTHER PUBLICATIONS

International Search Report issued Jul. 4, 2013 in PCT/IB2013/050625.

*Primary Examiner* — Gregory Webb
(74) *Attorney, Agent, or Firm* — Oblon, McClelland, Maier & Neustadt, L.L.P.

(57) ABSTRACT

A post chemical-mechanical-polishing (post-CMP) cleaning composition comprising: (A) at least one compound comprising at least one thiol (—SH), thioether (—SR$^1$) or thiocarbonyl (>C═S) group, wherein R$^1$ is alkyl, aryl, alkylaryl or arylalkyl, (B) at least one sugar alcohol which contains at least three hydroxyl (—OH) groups and does not comprise any carboxylic acid (—COOH) or carboxylate (—COO—) groups, and (C) an aqueous medium.

32 Claims, 3 Drawing Sheets

(51) Int. Cl.
*H01L 21/02* (2006.01)
*C11D 3/20* (2006.01)
*C11D 7/26* (2006.01)
*C11D 11/00* (2006.01)
*C11D 3/37* (2006.01)

(52) U.S. Cl.
CPC ............ *C11D 3/3757* (2013.01); *C11D 7/261* (2013.01); *C11D 7/268* (2013.01); *C11D 7/34* (2013.01); *C11D 11/0047* (2013.01); *C11D 11/0064* (2013.01); *H01L 21/02074* (2013.01)

(56) References Cited

U.S. PATENT DOCUMENTS

| | | |
|---|---|---|
| 2005/0197266 A1 | 9/2005 | Misra et al. |
| 2005/0245409 A1* | 11/2005 | Cernat .................... C11D 7/80 510/175 |
| 2008/0139436 A1* | 6/2008 | Reid ...................... C11D 3/044 510/176 |
| 2009/0130849 A1* | 5/2009 | Lee ....................... B24B 37/044 438/693 |
| 2009/0291873 A1 | 11/2009 | Tamboli |
| 2010/0261632 A1* | 10/2010 | Korzenski ............. C11D 7/265 510/175 |
| 2010/0286014 A1 | 11/2010 | Barnes |
| 2011/0136717 A1 | 6/2011 | Tamboli et al. |
| 2012/0083436 A1* | 4/2012 | Lee ........................ G03F 7/426 510/175 |
| 2012/0273010 A1* | 11/2012 | Duong ................... C11D 7/263 134/26 |
| 2012/0283163 A1 | 11/2012 | Barnes et al. |

FOREIGN PATENT DOCUMENTS

| | | |
|---|---|---|
| CN | 102197124 A | 9/2011 |
| WO | WO 2011/000694 A1 | 1/2011 |
| WO | WO 2011/000758 A1 | 1/2011 |

* cited by examiner

Z

S31

S33

S32

S34

S35

S38

S36

S39

S37

S40

Y

S41

S44

S42

S45

S43

S46

POST CHEMICAL-MECHANICAL-POLISHING (POST-CMP) CLEANING COMPOSITION COMPRISING A SPECIFIC SULFUR-CONTAINING COMPOUND AND A SUGAR ALCOHOL OR A POLYCARBOXYLIC ACID

FIELD OF THE INVENTION

This invention essentially relates to a post chemical-mechanical-polishing (post-CMP) cleaning composition and its use for removing residues and contaminants from the surface of semiconductor substrates. Moreover, this invention relates to the use of the post CMP cleaning composition for removing residues and contaminants comprising benzotriazole after CMP. Particularly, this invention relates to the use of the post CMP cleaning composition for removing residues and contaminants from the surface of semiconductor substrates comprising electrically conductive layers (such as copper layers), electrically insulating dielectric layers (such as low-k or ultra-low-k dielectric material layers) and barrier layers (such as tantalum, tantalum nitride, titanium nitride or ruthenium layers) after CMP.

DESCRIPTION OF THE PRIOR ART

In the semiconductor industry, chemical mechanical polishing (abbreviated as CMP) is a well-known technology applied in fabricating advanced photonic, microelectromechanical, and microelectronic materials and devices, such as semiconductor wafers.

During the fabrication of materials and devices used in the semiconductor industry, CMP is employed to planarize metal and/or oxide surfaces. CMP utilizes the interplay of chemical and mechanical action to achieve the planarity of the to-be-polished surfaces. The CMP process itself involves holding and rotating a thin, flat substrate of the semiconductor device against a wetted polishing pad under controlled pressure and temperature in the presence of CMP slurries. The CMP slurries contain abrasive materials and various chemical additives as appropriate to the specific CMP process and requirements. Following the CMP process, contaminants and residues comprising particles from the CMP slurries, added chemicals, and reaction by-products remain on the polished substrate surface. These residues that are left on the substrates following CMP processing can also include corrosion inhibitor compounds such as benzotriazole (BTA), which can—if for example the copper ion concentration exceeds the maximum solubility of the copper-inhibitor complexes during CMP—precipitate from solution and coagulate into a surface residue. In addition, the polishing of a substrate surface having copper/low-k or ultra-low-k dielectric materials often generates carbon-rich particles that settle onto the surface after CMP.

However, all residues and contaminants must be removed prior to any further steps in the microelectronic device fabrication process to avoid degradation of the device reliability and introduction of defects into the microelectronic devices.

In the state of the art, post-CMP cleaning compositions comprising sugar alcohols or derivatives thereof are known and described, for instance, in the following references.

U.S. Pat. No. 7,922,823 B2 discloses a method of processing a microelectronic device substrate to remove undesired material therefrom, said method comprising contacting the microelectronic device substrate after CMP with an effective amount of a composition comprising (i) alkanolamine, (ii) quaternary ammonium hydroxide and (iii) a specific complexing agent, wherein the complexing agent can include—inter alia—glycerol, sorbitol, xylitol, with the provision that the complexing agent does not include citric acid. A composition AP described in U.S. Pat. No. 7,922,823 B2 contains 9% monoethanolamine, 5% tetramethyl ammonium hydroxide, 3.8% sorbitol, balance water and shows good cleaning efficacy.

In the state of the art, post-CMP cleaning compositions comprising polycarboxylic acids are known and described, for instance, in the following references.

U.S. Pat. No. 7,087,562 B2 discloses a post-CMP washing liquid composition consisting of one type or two or more types of aliphatic polycarboxylic acids and one type or two or more types selected from the group consisting of glyoxylic acid, ascorbic acid, glucose, fructose, lactose, and mannose, the washing liquid composition having a pH of less than 3.0.

US 2010/0286014 A1 discloses an acidic composition comprising at least one surfactant, at least one dispersing agent, at least one sulfonic acid-containing hydrocarbon, and water, wherein said acidic composition is suitable for cleaning residue and contaminants from a microelectronic device having said residue and contaminants thereon. For example, the composition comprises one of the formulations A, B or C: alkylbenzene sulfonic acid, polyacrylic acid and methane sulfonic acid (formulation A); dodecylbenzene sulfonic acid, polyacrylic acid and methane sulfonic acid (formulation B); or dodecylbenzene sulfonic acid, polyacrylic acid, methane sulfonic acid, and citric acid (formulation C).

In the state of the art, post-CMP cleaning compositions containing a compound comprising a thiol, thioether or thiocarbonyl group are known and described, for instance, in the following references.

US 2005/0197266 A1 discloses a composition for cleaning a semiconductor workpiece, the composition comprising:
(a) a cleaning agent selected from the group consisting of: (i) ammonium citrate; (ii) ammonium oxalate; (iii) aspartic acid; (iv) benzoic acid; (v) citric acid; (vi) cysteine; (vii) glycine; (viii) gluconic acid; (ix) glutamic acid; (x) histidine; (xi) maleic acid; (xii) oxalic acid; (xiii) propionic acid; (xiv) salicylic acid; (xv) tartaric acid; (xvi) and mixtures thereof; and
(b) a corrosion-inhibiting compound is selected from the group consisting of: (i) ascorbic acid; (ii) benzotriazole; (iii) caffeic acid; (iv) cinnamic acid; (v) cysteine; (vi) glucose; (vii) imidazole; (viii) mercaptothiazoline; (ix) mercaptoethanol; (x) mercaptopropionic acid; (xi) mercaptobenzothiazole; (xii) mercaptomethylimidazole; (xiii) tannic acid; (xiv) thioglycerol; (xv) thiosalicylic acid; (xvi) triazole; (xvii) vanillin; (xviii) vanillic acid; (xix) and mixtures thereof. For example, the cleaning composition comprises ammonium citrate, ascorbic acid, and cysteine.

WO 2011/000694 A1 discloses an aqueous alkaline cleaning composition comprising (a) at least one thioamino acid having at least one primary amino group and at least one mercapto group, (b) at least one quaternary ammonium hydroxide, (c) at least one specific chelating and/or corrosion inhibiting agent, and (d) at least one organic solvent having wetting properties and a melting point below 0° C. For example, the cleaning composition comprises L-cysteine, tetramethylammonium hydroxide (referred to as TMAH in the following), ethylene diamine, and diethylene glycol monobutyl ether.

WO 2011/000758 A1 discloses an aqueous alkaline cleaning composition comprising (a) at least one thioamino acid having at least one secondary or tertiary amino group and at least one mercapto group and, and (b) at least one quaternary ammonium hydroxide. For example, the cleaning composition comprises N-acetylcysteine, TMAH, ethylene diamine, and diethylene glycol monobutyl ether. In another example, the cleaning composition comprises N-acetylcysteine, TMAH, diethylene triamine, 1,2,4-triazole, citric acid, and a surfactant such as 3,5-dimethyl-1-hexyn-3-ol or polyoxyethylene sorbitan laurate.

OBJECTS OF THE INVENTION

One of the objects of the present invention was to provide a post-CMP cleaning composition and a post-CMP cleaning process appropriate for post-CMP cleaning of copper-containing microelectronic substrates and showing an improved cleaning performance, particularly
 (i) the effective prevention of undesirable corrosion of copper-containing surfaces, or
 (ii) high efficiency of removing residues and contaminants which remained after the CMP step, or
 (iii) high efficiency of removing passivation films, especially benzotriazole films, from copper-containing surfaces, or
 (iv) applicability in moderate pH range such as from 4 to 8, or
 (v) the combination of (i) to (iv).

Furthermore, one of the objects of the present invention was to provide a post-CMP cleaning composition containing no or minimal amounts of organic solvents which can cause environmental and safety concerns. Moreover, one of the objects of the present invention was to provide a post-CMP cleaning composition which does not cause an increase of surface roughness of the copper-containing surface or an increase of defects thereon. Last but not least, a post-CMP cleaning process was sought that is easy to apply and requires as few steps as possible.

SUMMARY OF THE INVENTION

Accordingly, a post-CMP cleaning composition comprising:
 (A) at least one compound comprising at least one thiol (—SH), thioether (—SR$^1$) or thiocarbonyl (>C=S) group, wherein R$^1$ is alkyl, aryl, alkylaryl or arylalkyl,
 (B) at least one sugar alcohol which contains at least three hydroxyl (—OH) groups and does not comprise any carboxylic acid (—COOH) or carboxylate (—COO$^-$) groups, and
 (C) an aqueous medium
was found. This post-CMP cleaning composition of the invention is referred to as (Q1) or composition (Q1) in the following.

According to another aspect of the invention, a post-CMP cleaning composition comprising:
 (A) at least one compound comprising at least one thiol (—SH), thioether (—SR$^1$) or thiocarbonyl (>C=S) group, wherein R$^1$ is alkyl, aryl, alkylaryl or arylalkyl,
 (L) at least one oligomeric or polymeric polycarboxylic acid, and
 (C) an aqueous medium
was found. This post-CMP cleaning composition of the invention is referred to as (Q2) or composition (Q2) in the following.

(Q1) and/or (Q2) are generally referred to as (Q) or composition (Q) in the following.

Moreover, the use of the composition (Q) for removing residues and contaminants from the surface of semiconductor substrates useful for manufacturing microelectronic devices was found.

Furthermore, the process for manufacturing microelectronic devices from semiconductor substrates comprising the step of removing residues and contaminants from the surface of the semiconductor substrates by contacting them at least once with the composition (Q) was found. This process of the invention is referred to as the process (P) in the following.

Preferred embodiments are explained in the claims and the specification. It is understood that combinations of preferred embodiments are within the scope of the present invention.

Advantages of the Invention

In view of the prior art discussed above, it was surprising and could not be expected by the person skilled in the art that the objects underlying the present invention could be solved by the composition (Q) and by the process (P).

It was particularly surprising that the composition (Q) and the process (P) were excellently suited for post-processing substrates useful for fabricating electrical devices, in particular, semiconductor integrated circuits (ICs), more preferably ICs with LSI (large-scale integration) or VLSI (very-large-scale integration). It was even more surprising that the composition (Q) and the process (P) were most excellently suited for high precision fabrication methods involving inter alia surface preparation, pre-plating cleaning, post-etch cleaning and/or post-CMP cleaning steps. The composition (Q) and the process (P) were most particularly well-suited for carrying out the above-mentioned cleaning steps, in particular, the post-CMP cleaning of semiconductor wafers and the fabrication of ICs with LSI or VLSI, in particular by the copper damascene or dual damascene process.

All kinds of residues and contaminants generated during the substrate surface preparation, deposition, plating, etching and CMP—particularly during CMP—were removed most efficiently by the composition (Q) and by the process (P), and it was ensured that the substrates, in particular the ICs, were free from residues and contaminants that would have otherwise deleteriously affected the functions of the electrical and optical devices, in particular the ICs, or would have rendered them even useless for their intended functions. In particular, the scratching, etching and roughening of the copper metallization in damascene structures were prevented by the composition (Q) and by the process (P). Furthermore, the passivation film, especially the benzotriazole film, was also completely removed from the copper-containing surfaces by the composition (Q) and the process (P). Moreover, the corrosion of the copper-containing surfaces was prevented by the composition (Q) and the process (P). Last but not least, the composition (Q) and the process (P) were applicable in moderate pH range such as from 4 to 8.

DETAILED DESCRIPTION OF THE INVENTION

The composition (Q) is used for removing residues and contaminants from the surface of semiconductor substrates useful for manufacturing microelectronic devices. Said residues and contaminants can be any residues and contaminants, including but not limited to abrasive particles, processing residues, metal oxides including copper oxide, metallic ions, salts, passivation films, and abraded or decomposed low-k or ultra-low-k dielectric materials. Said residues and contaminants preferably comprise a passivation film, more preferably comprise an N-heterocyclic compound, most preferably comprise diazoles, triazoles, tetrazoles, or a derivative thereof, particularly preferably comprise benzotriazole, or a derivative thereof, for instance comprise benzotriazole. Particularly, (Q) is used for removing residues and contaminants comprising benzotriazole or a derivative thereof from the copper-containing surface of semiconductor substrate after CMP. For example, (Q) is used for removing a passivation film comprising benzotriazole from the copper-containing surface of a semiconductor substrate after CMP.

Preferably, the composition (Q) is used for removing residues and contaminants from the surface of semiconductor substrates useful for manufacturing microelectronic devices after CMP. More preferably, the composition (Q) is used for removing residues and contaminants from said surface after said surface has been polished in a CMP step.

Said semiconductor substrates preferably comprise electrically conductive layers, electrically insulating dielectric layers and barrier layers, more preferably comprise
- electrically conductive layers containing or consisting of copper,
- electrically insulating dielectric layers consisting of low-k or ultra-low-k dielectric materials, and
- barrier layers containing or consisting of tantalum, tantalum nitride, titanium nitride, cobalt, nickel, manganese, ruthenium, ruthenium-nitride, ruthenium-carbide, or ruthenium tungsten nitride.

Although the composition (Q) can be advantageously used for other purposes, it is particularly well-suited for the process (P).

Microelectronic devices can be manufactured from semiconductor substrates by the process (P), the process (P) comprises the step of removing residues and contaminants from the surface of semiconductor substrates by contacting them at least once with the composition (Q). Said residues and contaminants preferably comprise a passivation film, more preferably comprise an N-heterocyclic compound, most preferably comprise diazoles, triazoles, tetrazoles, or a derivative thereof, particularly preferably comprise benzotriazole, or a derivative thereof, for instance comprise benzotriazole. Particularly, (P) comprises the step of removing residues and contaminants comprising benzotriazole or a derivative thereof from the copper-containing surface of semiconductor substrates by contacting them at least once with (Q).

Preferably, the process (P) comprises the step of removing residues and contaminants from the surface of semiconductor substrates by contacting them at least once with the composition (Q) after CMP. More preferably, process (P) comprises the step of removing residues and contaminants from the surface of semiconductor substrates by contacting them at least once with the composition (Q) after said surface has been polished in a CMP step.

The process (P) cannot only be used for the post-CMP cleaning but also for photoresists stripping and post-etch residue removal. However, the process (P) exhibits its particular advantages in the post-CMP cleaning of the above-described semiconductor substrates.

The composition (Q) comprises at least one compound (A) comprising at least one thiol (—SH), thioether (—SR$^1$) or thiocarbonyl (>C=S) group, wherein R$^1$ is alkyl, aryl, alkylaryl or arylalkyl. Preferably, the composition (Q) comprises one compound (A).

In general, the compound (A) can be contained in varying amounts in the composition (Q), and the amounts or the concentration of (A) can be adjusted most advantageously according to the particular requirements of a given composition, use and method of the invention. The amount of (A) is preferably not more than 1.5 weight percent (referred to as "wt. %" in the following), more preferably not more than 0.5 wt. %, most preferably not more than 0.1 wt. %, particularly not more than 0.07 wt. %, for example not more than 0.05 wt. %, based on the total weight of the composition (Q). The amount of (A) is preferably at least 0.0005 wt. %, more preferably at least 0.001 wt. %, most preferably at least 0.004 wt. %, particularly at least 0.01 wt. %, for example at least 0.03 wt. %, based on the total weight of the composition (Q).

Preferably, the compound (A) is a compound comprising
(A1) at least one thiol (—SH), thioether (—SR$^1$), or thiocarbonyl (>C=S) group and
(A2) at least one amino (—NH$_2$, —NHR$^2$, or —NR$^3$R$^4$) group,
wherein R$^1$, R$^2$, R$^3$ and R$^4$ is—independently from each other—alkyl, aryl, alkylaryl or arylalkyl. For the (A2) part, generally amino groups —NH$_2$ and —NHR$^2$ are more preferred, and amino groups —NH$_2$ are most preferred.

According to one embodiment, the compound (A) is preferably a compound comprising
(A1) at least one thiocarbonyl (>C=S) group and
(A2) at least one amino (—NH$_2$, —NHR$^2$, or —NR$^3$R$^4$) group,
wherein R$^2$, R$^3$ and R$^4$ is—independently from each other—alkyl, aryl, alkylaryl or arylalkyl.

More preferably, (A) is a compound comprising
(A1) one thiocarbonyl (>C=S) group and
(A2) at least two amino (—NH$_2$, —NHR$^2$, or —NR$^3$R$^4$) groups.

Most preferably, (A) is thiourea or a derivative thereof. Particularly, (A) is thiourea.

According to another embodiment, the compound (A) is preferably a compound comprising
(A1) at least one thiol (—SH), or thioether (—SR$^1$) group, and
(A2) at least one amino (—NH$_2$, —NHR$^2$, or —NR$^3$R$^4$) group,
wherein R$^1$, R$^2$, R$^3$ and R$^4$ is—independently from each other—alkyl, aryl, alkylaryl or arylalkyl.

More preferably, (A) is an amino acid comprising at least one thiol (—SH) or thioether (—SR$^1$) group, or a derivative of this amino acid, wherein R$^1$ is alkyl, aryl, alkylaryl or arylalkyl. Most preferably, (A) is an amino acid comprising at least one thiol (—SH) group or a derivative of this amino acid. Particularly, (A) is an amino acid comprising one thiol (—SH) group or a derivative of this amino acid. Particularly preferably, (A) is cysteine, cystine, glutathione, N-acetylcysteine, or a derivative thereof. For example, (A) is cysteine or N-acetylcysteine.

R$^1$ can generally be any substituted or unsubstituted alkyl, aryl, alkylaryl, or arylalkyl group. R$^1$ is preferably alkyl, more preferably unsubstituted alkyl, most preferably C$_1$ to C$_{20}$ alkyl, particularly C$_1$ to C$_{10}$ alkyl, for example C$_1$ to C$_4$ alkyl.

R$^2$ can generally be any substituted or unsubstituted alkyl, aryl, alkylaryl, or arylalkyl group. R$^2$ is preferably alkyl, more preferably unsubstituted alkyl, most preferably $C_1$ to $C_{20}$ alkyl, particularly $C_1$ to $C_{10}$ alkyl, for example $C_1$ to $C_4$ alkyl.

$R^3$ can generally be any substituted or unsubstituted alkyl, aryl, alkylaryl, or arylalkyl group. $R^3$ is preferably alkyl, more preferably unsubstituted alkyl, most preferably $C_1$ to $C_{20}$ alkyl, particularly $C_1$ to $C_{10}$ alkyl, for example $C_1$ to $C_4$ alkyl.

$R^4$ can generally be any substituted or unsubstituted alkyl, aryl, alkylaryl, or arylalkyl group. $R^4$ is preferably alkyl, more preferably unsubstituted alkyl, most preferably $C_1$ to $C_{20}$ alkyl, particularly $C_1$ to $C_{10}$ alkyl, for example $C_1$ to $C_4$ alkyl.

The composition (Q1) comprises at least one sugar alcohol which contains at least three hydroxyl (—OH) groups and does not comprise any carboxylic acid (—COOH) or carboxylate (—COO⁻) groups. The composition (Q2) can further optionally comprise at least one sugar alcohol which contains at least three hydroxyl (—OH) groups and does not comprise any carboxylic acid (—COOH) or carboxylate (—COO⁻) groups.

Generally, said sugar alcohol (B) can be contained in varying amounts in the composition (Q), and the amounts or the concentration of (B) can be adjusted most advantageously according to the particular requirements of a given composition, use and method of the invention. Preferably, the amount of (B) is not more than 1.5 wt. %, more preferably not more than 0.5 wt. %, most preferably not more than 0.2 wt. %, particularly not more than 0.1 wt. %, for example not more than 0.06 wt. %, based on the total weight of the composition (Q). Preferably, the amount of (B) is at least 0.0005 wt. %, more preferably at least 0.001 wt. %, most preferably at least 0.007 wt. %, particularly at least 0.02 wt. %, for example at least 0.04 wt. %, based on the total weight of the composition (Q).

In general, a sugar alcohol is a hydrogenated form of carbohydrate, of which a carbonyl group or acetal group has been reduced to a primary or secondary hydroxyl group.

Said sugar alcohol (B) contains preferably at least four hydroxyl (—OH) groups, more preferably 4 to 18 hydroxyl (—OH) groups, most preferably 4 to 9 hydroxyl (—OH) groups, particularly 4 to 6 hydroxyl (—OH) groups, for example 4 hydroxyl (—OH) groups.

Generally, the hydroxyl (—OH) groups contained in said sugar alcohol (B) can be any type of hydroxyl (—OH) groups. Preferably, said hydroxyl (—OH) groups are such hydroxyl (—OH) groups which are essentially not dissociable in aqueous medium, more preferably, said hydroxyl (—OH) groups are such hydroxyl (—OH) groups which are not dissociable in aqueous medium.

In general, said sugar alcohol (B) can be a saturated sugar alcohol, i.e. a sugar alcohol which does not comprise any C—C double or triple bonds, or an unsaturated sugar alcohol, i.e. a sugar alcohol comprising at least one C—C double or triple bond. Preferably, (B) is a saturated sugar alcohol. More preferably, (B) is a saturated sugar alcohol which contains at least four hydroxyl (—OH) groups.

Generally, said sugar alcohol (B) can be a substituted or unsubstituted sugar alcohol and is preferably an O-substituted (i.e. substituted on at least one of the oxygen atoms of the sugar alcohol) or unsubstituted sugar alcohol, more preferably a mono-O-substituted (i.e. substituted on one of the oxygen atoms of the sugar alcohol) or unsubstituted sugar alcohol, most preferably an unsubstituted sugar alcohol. Examples for mono-O-substituted sugar alcohols (B) are isomalt, maltitol, or lactitol, examples for unsubstituted sugar alcohols (B) are erythritol, threitol, arabitol, xylitol, ribitol, mannitol, sorbitol, galactitol, iditol, or inositol.

Preferably, said sugar alcohol (B) is
(B1) an alditol selected from the group consisting of tetritol, pentitol, hexitol, heptitol, and octitol, or dimers or oligomers thereof, or
(B2) a cyclitol, or dimers or oligomers thereof, or
(B3) pentaerythritol, or dimers or oligomers thereof,
or a mixture thereof. More preferably, (B) is (B1). Most preferably, (B) is a tetritol, pentitol, or hexitol, or a mixture thereof. Particularly preferably, (B) is erythritol, threitol, arabitol, xylitol, ribitol, mannitol, sorbitol, galactitol, iditol, isomalt, maltitol, lactitol, or a stereoisomer thereof, or a mixture thereof. Most particularly preferably, (B) is erythritol, threitol, xylitol, mannitol, sorbitol, or a stereoisomer thereof, or a mixture thereof. Particularly, (B) is erythritol, threitol, or a stereoisomer thereof, or a mixture thereof. For example, (B) is erythritol.

In the embodiment where said sugar alcohol (B) is (B2), (B2) is more preferably O-substituted or unsubstituted inositol, or a stereoisomer thereof, or a mixture thereof, and (B2) is most preferably unsubstituted inositol, or a stereoisomer thereof, or a mixture thereof, and (B2) is for example inositol.

According to the invention, the composition (Q) contains an aqueous medium (C). (C) can be of one type or a mixture of different types of aqueous media.

In general, the aqueous medium (C) can be any medium which contains water. Preferably, the aqueous medium (C) is a mixture of water and an organic solvent miscible with water (e.g. an alcohol, preferably a $C_1$ to $C_3$ alcohol, or an alkylene glycol derivative). More preferably, the aqueous medium (C) is water. Most preferably, aqueous medium (C) is de-ionized water.

If the amounts of the components other than (C) are in total y % by weight of the composition (Q), then the amount of (C) is (100–y) % by weight of the composition (Q).

The composition (Q) can further optionally contain at least one metal chelating agent (D), preferably one metal chelating agent (D). In general, a metal chelating agent used in a post-CMP cleaning composition is a chemical compound that forms soluble, complex molecules with certain metal ions, inactivating the ions so that they cannot normally react with other elements or ions to produce precipitates or scale.

Generally, said metal chelating agent (D) can be contained in varying amounts in the composition (Q), and the amounts or the concentration of (D) can be adjusted most advantageously according to the particular requirements of a given composition, use and method of the invention. Preferably, the amount of (D) is not more than 1.5 wt. %, more preferably not more than 0.5 wt. %, most preferably not more than 0.2 wt. %, particularly not more than 0.1 wt. %, for example not more than 0.06 wt. %, based on the total weight of the composition (Q). Preferably, the amount of (D) is at least 0.0005 wt. %, more preferably at least 0.001 wt. %, most preferably at least 0.007 wt. %, particularly at least 0.02 wt. %, for example at least 0.04 wt. %, based on the total weight of the composition (Q).

Preferably, the metal chelating agent (D) is a compound comprising at least two carboxylic acid (—COOH) or carboxylate (—COO⁻) groups. More preferably, (D) is a compound comprising at least three carboxylic acid (—COOH) or carboxylate (—COO⁻) groups. Most preferably, the metal chelating agent (D) is selected from the group consisting of
(D1) propane-1,2,3-tricarboxylic acid,
(D2) citric acid, (D3) butane-1,2,3,4-tetracarboxylic acid,
(D4) pentane-1,2,3,4,5-pentacarboxylic acid,
(D5) trimellitic acid,
(D6) trimesinic acid,
(D7) pyromellitic acid,
(D8) mellitic acid, and
(D9) oligomeric and polymeric polycarboxylic acids.

Particularly preferably, (D) is selected from the group consisting of (D1), (D2), (D3), (D4), (D5), (D6), (D7) and (D8). Particularly, (D) is selected from the group consisting of (D1), (D2), (D3) and (D4). For example, the metal chelating agent (D) is citric acid (D2).

In the embodiment where the metal chelating agent (D) is (D9), the weight average molecular weight of (D9) as determined by gel permeation chromatography is preferably less than 20,000 Dalton, more preferably less than 15,000 Dalton, most preferably less than 10,000 Dalton, particularly less than 5,000 Dalton, and preferably more than 500 Dalton, more preferably more than 1,000 Dalton, most preferably more than 2,000 Dalton, particularly more than 2,500 Dalton. (D9) can be homopolymers, i.e., polyacrylic acid or polymethacrylic acid—preferably polyacrylic acid—homopolymers or copolymers. Said copolymers may contain essentially any suitable other monomeric units, preferably monomeric units comprising at least one carboxylic acid group, in particular, monomeric units derived from fumaric acid, maleic acid, itaconic acid, aconitic acid, mesaconic acid, citraconic acid, methylenemalonic acid or maleic anhydride. Most preferably, said copolymer is a maleic acid/acrylic acid copolymer. For example, said copolymer is Sokalan® CP 12S.

An oligomeric polycarboxylic acid is a polycarboxylic acid having at least 7 carboxylic acid groups. A polymeric polycarboxylic acid is a polycarboxylic acid having at least 30 carboxylic acid groups.

The composition (Q2) comprises at least one oligomeric or polymeric polycarboxylic acid (L).

Generally, the oligomeric or polymeric polycarboxylic acid (L) can be contained in varying amounts in the composition (Q), and the amounts or the concentration of (L) can be adjusted most advantageously according to the particular requirements of a given composition, use and method of the invention. Preferably, the amount of (L) is not more than 1.5 wt. %, more preferably not more than 0.5 wt. %, most preferably not more than 0.2 wt. %, particularly not more than 0.1 wt. %, for example not more than 0.06 wt. %, based on the total weight of the composition (Q). Preferably, the amount of (L) is at least 0.0005 wt. %, more preferably at least 0.001 wt. %, most preferably at least 0.007 wt. %, particularly at least 0.02 wt. %, for example at least 0.04 wt. %, based on the total weight of the composition (Q).

(L) is an oligomeric or polymeric polycarboxylic acid having at least 7, preferably at least 9, more preferably at least 12, most preferably at least 16, particularly preferably at least 20, particularly at least 25, for example at least 30 carboxylic acid groups.

(L) is preferably an oligomeric or polymeric polycarboxylic acid containing acrylic acid and/or methacrylic acid monomeric units, more preferably an oligomeric or polymeric polycarboxylic acid containing acrylic acid monomeric units. The weight average molecular weight of (L) as determined by gel permeation chromatography is preferably less than 20,000 Dalton, more preferably less than 15,000 Dalton, most preferably less than 10,000 Dalton, particularly less than 5,000 Dalton, and preferably more than 500 Dalton, more preferably more than 1,000 Dalton, most preferably more than 2,000 Dalton, particularly more than 2,500 Dalton. (L) can be homopolymers, i.e., polyacrylic acid or polymethacrylic acid—preferably polyacrylic acid—homopolymers or copolymers. More preferably, (L) is a copolymer containing acrylic acid monomeric units. Said copolymer containing acrylic acid monomeric units may contain essentially any suitable other monomeric units, preferably monomeric units comprising at least one carboxylic acid group, in particular, monomeric units derived from fumaric acid, maleic acid, itaconic acid, aconitic acid, mesaconic acid, citraconic acid, methylenemalonic acid or maleic anhydride. Most preferably, said copolymer is a maleic acid/acrylic acid copolymer. For example, said copolymer is Sokalan® CP 12S.

The composition (Q) can further optionally contain at least one surfactant (E), preferably one surfactant (E), more preferably one surfactant (E) which is selected from the group of water-soluble or water-dispersible—preferably water-soluble—amphiphilic nonionic surfactants (E1), (E2) and (E3).

In general, a surfactant used in a post-CMP cleaning composition is a surface-active compound which decreases the surface tension of a liquid, the interfacial tension between two liquids, or that between a liquid and a solid.

Generally, said surfactant (E) can be contained in varying amounts in the composition (Q), and the amounts or the concentration of (E) can be adjusted most advantageously according to the particular requirements of a given composition, use and method of the invention. Preferably, the amount of (E) is not more than 5 wt. %, more preferably not more than 2 wt. %, most preferably not more than 1 wt. %, particularly not more than 0.5 wt. %, for example not more than 0.3 wt. %, based on the total weight of the composition (Q). Preferably, the amount of (E) is at least 0.0005 wt. %, more preferably at least 0.005 wt. %, most preferably at least 0.01 wt. %, particularly at least 0.05 wt. %, for example at least 0.1 wt. %, based on the total weight of the composition (Q).

The amphiphilic nonionic surfactant (E1) comprises at least one hydrophobic group (e11). This means that (E1) can have more than one hydrophobic group (e11), e.g., 2, 3 or more groups (e11), which are separated from each other by at least one hydrophilic group (e12) hereinbelow described.

The hydrophobic group (e11) is selected from the group consisting of branched alkyl groups having 5 to 20, preferably 7 to 16 and, most preferably 8 to 15 carbon atoms.

Preferably, the branched alkyl groups (e11) have on the average a degree of branching of from 1 to 5, preferably 1 to 4 and, most preferably, 1 to 3.

Suitable branched alkyl groups (e11) are derived from isopentane, neopentane and the branched hexane, heptane, octane, nonane, decane, undecane, dodecane, tridecane, tetradecane, pentadecane, hexadecane, heptadecane, nonadecane and eicosane isomers.

Most preferably, the branched alkyl groups (e11) are derived from Guerbet-alcohols having 8 to 15, preferably, 10 carbon atoms (cf. Römpp Online 2011, "Guerbet-Reaktion").

(E1) comprises at least one hydrophilic group (e12). This means that (E1) can contain more than one group (e12), e.g., 2, 3 or more groups (e12), which are separated from each other by hydrophobic groups (e11).

The hydrophilic groups (e12) consist of oxyethylene monomer units. The degree of polymerization of the hydrophilic groups (e12) can vary broadly and, therefore, can be adapted most advantageously to the particular requirements of a given composition, use and method of the invention.

Preferably, the degree of ethoxylation is in the range of from 4 to 20, more preferably 6 to 16 and, most preferably, 7 to 8.

(E1) can have different blocklike general structures. Examples of such general blocklike structures are:
e11-e12,
e11-e12-e11,
e12-e11-e12,
e12-e11-e12-e11,
e11-e12-e11-e12-e11, and
e12-e11-e12-e11-e12.

Most preferably, the blocklike general structure e11-e12 is used.

Preferably, the weight average molecular weight of (E1) is in the range of from 300 to 800 Dalton, preferably 400 to 750 Dalton and, most preferably, 400 to 600 Dalton, as determined by size exclusion chromatography.

Preferably, the hydrophilic-lipophilic balance (HLB) value is in the range of 8 to 16, preferably 9 to 15 and, most preferably, 11 to 14.

The amphiphilic nonionic surfactants (E1) are customary and known materials and are available from BASF SE under the trademark Lutensol®. (E1) is particularly Lutensol® XP80 or Lutensol® XP70, for example Lutensol® XP80.

The amphiphilic nonionic surfactant (E2) also comprises at least one hydrophobic group (e21) and at least one hydrophilic group (e22).

This means that the amphiphilic nonionic surfactant (E2) contains more than one group (e22), e.g., 2, 3 or more groups (e22) which are separated from each other by hydrophobic groups (e21) or it contains more than one group (e22), e.g., 2, 3 or more groups (e22), which are separated from each other by hydrophobic groups (e21).

The amphiphilic nonionic surfactant (E2) can have different blocklike general structures. Examples of such general blocklike structures are:
e21-e22,
e21-e22-e21,
e22-e21-e22,
e22-e21-e22-e21,
e21-e22-e21-e22-e21, and
e22-e21-e22-e21-e22.

Most preferably, the blocklike general structure e21-e22 is used.

Preferably, the hydrophobic groups (e11) described above are used as the hydrophobic groups (e21).

The hydrophilic group (e22) comprises oxyethylene monomer units (e221).

Moreover, the hydrophilic group (e22) comprises at least one type of substituted oxyalkylene monomer units (e222), wherein the substituents are selected from the group consisting of alkyl, cycloalkyl, aryl, alkyl-cycloalkyl, alkyl-aryl, cycloalkyl-aryl and alkyl-cycloalkyl-aryl groups.

Preferably, the oxyalkylene monomer units (e222) are derived from substituted oxiranes wherein the substituents are selected from the group consisting of alkyl, cycloalkyl, aryl, alkyl-cycloalkyl, alkyl-aryl, cycloalkyl-aryl and alkyl-cycloalkyl-aryl groups.

The substituents of the oxiranes are preferably selected from the group consisting of alkyl groups having 1 to 10 carbon atoms, cycloalkyl groups having 5 to 10 carbon atoms in spirocyclic, exocyclic and/or annealed configuration, aryl groups having 6 to 10 carbon atoms, alkyl-cycloalkyl groups having 6 to 20 carbon atoms, alkyl-aryl groups having 7 to 20 carbon atoms, cycloalkyl-arylgroup having 11 to 20 carbon atoms, and alkyl-cycloalkyl-aryl groups having 12 to 30 carbon atoms.

Examples of suitable alkyl groups are methyl, ethyl, propyl, isopropyl, n-butyl, n-pentyl, and n-hexyl. Examples of suitable cycloalkyl groups are cyclopentyl, and cyclohexyl. Examples of suitable aryl groups are phenyl and 1- and 2-naphthyl.

Examples for particularly preferred substituted oxiranes are methyl oxirane (propyleneoxide) and ethyl oxirane (butylene oxide).

Preferably, the hydrophilic group (e22) consists of the monomer units (e221) and (e222).

The polyoxyalkylene group contains the monomer units (e221) and (e222) in random, alternating, gradient and/or blocklike distribution. This means, that one hydrophilic group (e22) can have only one type of distribution, i.e.,
random: . . . -e221-e221-e222-e221-e222-e222-e222-e221-e222- . . . ;
alternating: . . . -e221-e222-e221-e222-e221- . . . ;
gradient: . . . e221-e221-e221-e222-e221-e221-e222-e222-e221-e222-e222-e222- . . . ; or
blocklike: . . . -e221-e221-e221-e221-e222-e222-e222-e222- . . . .

Or the hydrophilic group (e22) can contain at least two types of distributions, e.g., an oligomeric or polymeric segment having a random distribution and an oligomeric or polymeric segment having an alternating distribution.

Preferably, the hydrophilic group (e22) has only one type of distribution. Most preferably, the distribution is random or blocklike.

The molar ratio of oxyethylene monomer units (e221) to oxyalkylene monomer units (e222) can vary broadly and, therefore, can be adjusted most advantageously to the particular requirements of a given composition, the method and the use of the invention. Preferably the molar ratio (e221):(e222) is from 100:1 to 1:1, more preferably, from 60:1 to 1.5:1 and, most preferably, from 50:1 to 1.5:1.

Also the degree of polymerization of the oligomeric or polymeric polyoxyalkylene groups (e22) can vary broadly and, therefore, can be adjusted most advantageously to the particular requirements of a given composition, the method and the use of the invention. Preferably, the degree of polymerization is in the range of from 5 to 100, preferably 5 to 90, and most preferably, 5 to 80.

The amphiphilic nonionic surfactants (E2) are customary and known materials and are commercially available from BASF SE under the trademark Plurafac™ or from Dow under the trademark Triton™.

The amphiphilic nonionic surfactants (E3) are alkyl polyglucosides (APG). The APG preferably have an average degree of polymerization of 1 to 5, preferably 1.2 to 1.5. Preferably, the alkyl groups of the APG have 8 to 16 carbon atoms and, most preferably, 12 to 14 carbon atoms. The APG are customary and known materials and are available from Cognis under the trademark Glucopon™.

Preferably, the surfactant (E) is selected from the group consisting of:
(E1) amphiphilic nonionic, water-soluble or water-dispersible surfactants having
(e11) at least one hydrophobic group selected from the group consisting of branched alkyl groups having 5 to 20 carbon atoms; and
(e12) at least one hydrophilic group consisting of oxyethylene monomer units;
(E2) amphiphilic nonionic, water-soluble or water-dispersible surfactants having
(e21) at least one hydrophobic group selected from the group consisting of branched alkyl groups having 5 to 20 carbon atoms; and (e22) at least one hydrophilic group selected from the group consisting of polyoxyalkylene groups comprising
(e221) oxyethylene monomer units and
(e222) at least one type of substituted oxyalkylene monomer units wherein the substituents are selected from the group consisting of alkyl, cycloalkyl, aryl, alkyl-cycloalkyl, alkyl-aryl, cycloalkyl-aryl and alkyl-cycloalkyl-aryl groups;
the said polyoxyalkylene group of (e22) containing the monomer units (e221) and (e222) in random, alternating, gradient and/or blocklike distribution; and
(E3) amphiphilic nonionic, water-soluble or water-dispersible alkyl polyglucoside surfactants.

More preferably, the surfactant (E) is
(E1) amphiphilic nonionic, water-soluble or water-dispersible surfactants having
(e11) at least one hydrophobic group selected from the group consisting of branched alkyl groups having 5 to 20 carbon atoms; and
(e12) at least one hydrophilic group consisting of oxyethylene monomer units.

The properties of the composition (Q) and of the process (P), such as cleaning performance in general and the efficiency of removing passivation films, may depend on the pH of the corresponding composition. The pH value of the composition (Q) is preferably at least 2, more preferably at least 3, most preferably at least 4, particularly at least 5, for example at least 5.5. The pH value of the composition (Q) is preferably not more than 11, more preferably not more than 10, most preferably not more than 9, particularly preferably not more than 8, particularly not more than 7, for example not more than 6.5.

The composition (Q) can further optionally contain at least one pH adjusting agent (G). In general, the pH adjusting agent (G) is a compound which is added to the composition (Q) to have its pH value adjusted to the required value. Preferably, the composition (Q) contains at least one pH adjusting agent (G). Preferred pH adjusting agents (G) are inorganic acids, carboxylic acids, amine bases, alkali hydroxides, ammonium hydroxides, including tetraalkylammonium hydroxides. Particularly, the pH adjusting agent (G) is nitric acid, sulfuric acid, ammonia, sodium hydroxide, or potassium hydroxide. For example, the pH adjusting agent (G) is nitric acid, or potassium hydroxide.

If present, the pH adjusting agent (G) can be contained in varying amounts. If present, the amount of (G) is preferably not more than 10 wt. %, more preferably not more than 2 wt. %, most preferably not more than 0.5 wt. %, particularly not more than 0.1 wt. %, for example not more than 0.05 wt. %, based on the total weight of the composition (Q). If present, the amount of (G) is preferably at least 0.0005 wt. %, more preferably at least 0.005 wt. %, most preferably at least 0.025 wt. %, particularly at least 0.1 wt. %, for example at least 0.4 wt. %, based on the total weight of the composition (Q).

The composition (Q) may also contain, if necessary, various other additives, including but not limited to stabilizers, friction reducing agents, biocides, or preservatives etc. Said other additives are for instance those commonly employed in post-CMP cleaning compositions and thus known to the person skilled in the art. Such addition can for example stabilize the post-CMP cleaning compositions, or improve the cleaning performance.

If present, said other additive can be contained in varying amounts. Preferably, the total amount of said other additives is not more than 10 wt. %, more preferably not more than 2 wt. %, most preferably not more than 0.5 wt. %, particularly not more than 0.1 wt. %, for example not more than 0.01 wt. %, based on the total weight of the composition (Q). Preferably, the total amount of said other additives is at least 0.0001 wt. %, more preferably at least 0.001 wt. %, most preferably at least 0.008 wt. %, particularly at least 0.05 wt. %, for example at least 0.3 wt. %, based on the total weight of the composition (Q).

For the following preferred embodiments (PE1) to (PE32),
(A-i) stands for "a compound comprising at least one thiol (—SH), thioether (—SR$^1$), or thiocarbonyl (>C=S) group and at least one amino (—NH$_2$, —NHR$^2$, or —NR$^3$R$^4$) group and wherein R$^1$, R$^2$, R$^3$ and R$^4$ is— independently from each other—alkyl, aryl, alkylaryl or arylalkyl";
(A-ii) stands for "cysteine, cystine, glutathione, N-acetyl-cysteine, or a derivative thereof";
(B-i) stands for "a saturated sugar alcohol which contains at least four hydroxyl (—OH) groups and does not comprise any carboxylic acid (—COOH) or carboxylate (—COO$^-$) groups";
(B-ii) stands for "erythritol, threitol, arabitol, xylitol, ribitol, mannitol, sorbitol, galactitol, iditol, isomalt, maltitol, lactitol, inositol or a stereoisomer thereof, or a mixture thereof";
(D-i) stands for "a metal chelating agent selected from the group consisting of propane-1,2,3-tricarboxylic acid, citric acid, butane-1,2,3,4-tetracarboxylic acid, pentane-1,2,3,4,5-pentacarboxylic acid, trimellitic acid, trimesinic acid, pyromellitic acid, mellitic acid and oligomeric or polymeric polycarboxylic acids".
(L-i) stands for "an oligomeric or polymeric polycarboxylic acid which is a copolymer containing
(i) acrylic acid monomeric units, and
(ii) monomeric units derived from fumaric acid, maleic acid, itaconic acid, aconitic acid, mesaconic acid, citraconic acid, methylenemalonic acid or maleic anhydride."

According to the preferred embodiment (PE1), the composition (Q) comprises
(A) being (A-i),
(B) being (B-i), and
(C) an aqueous medium.

According to another preferred embodiment (PE2), the composition (Q) comprises
(A) being (A-i),
(B) being (B-ii), and
(C) an aqueous medium.

According to another preferred embodiment (PE3), the composition (Q) comprises
(A) thiourea, or a derivative thereof,
(B) being (B-i), and
(C) an aqueous medium.

According to another preferred embodiment (PE4), the composition (Q) comprises
(A) being (A-ii),
(B) being (B-i), and
(C) an aqueous medium.

According to another preferred embodiment (PE5), the composition (Q) comprises
(A) being (A-ii),
(B) being (B-i), and
(C) an aqueous medium,
wherein the composition (Q) has a pH value of from 4 to 8.

According to another preferred embodiment (PE6), the composition (Q) comprises
(A) being (A-ii),
(B) being (B-ii), and
(C) an aqueous medium.

According to another preferred embodiment (PE7), the composition (Q) comprises
(A) being (A-ii),
(B) being (B-i),
(C) an aqueous medium, and
(D) being (D-i).

According to another preferred embodiment (PE8), the composition (Q) comprises
(A) being (A-i),
(B) being (B-i),
(C) an aqueous medium, and
(D) being (D-i).

According to another preferred embodiment (PE9), the composition (Q) comprises
(A) being (A-ii),
(B) being (B-i),
(C) an aqueous medium, and
(D) citric acid.

According to another preferred embodiment (PE10), the composition (Q) comprises
(A) being (A-ii),
(B) being (B-i),
(C) an aqueous medium, and
(D) an oligomeric or polymeric polycarboxylic acid containing acrylic acid monomeric units.

According to another preferred embodiment (PE11), the composition (Q) comprises
(A) being (A-ii),
(B) being (B-i),
(C) an aqueous medium, and
(D) a maleic acid/acrylic acid copolymer.

According to another preferred embodiment (PE12), the composition (Q) comprises
(A) being (A-ii),
(B) being (B-ii),
(C) an aqueous medium, and
(D) being (D-i).

According to another preferred embodiment (PE13), the composition (Q) comprises
(A) being (A-i),
(B) being (B-i),
(C) an aqueous medium,
(D) a metal chelating agent, and
(E) a surfactant.

According to another preferred embodiment (PE14), the composition (Q) comprises
(A) being (A-i),
(B) being (B-i),
(C) an aqueous medium,
(D) a metal chelating agent, and
(E) a water-soluble or water-dispersible amphiphilic nonionic surfactant.

According to another preferred embodiment (PE15), the composition (Q) comprises
(A) being (A-ii),
(B) being (B-i),
(C) an aqueous medium,
(D) a compound comprising at least three carboxylic acid (—COOH) or carboxylate (—COO⁻) groups as a metal chelating agent, and
(E) a surfactant,
wherein the composition (Q) has a pH value of from 4 to 8.

According to another preferred embodiment (PE16), the composition (Q) comprises
(A) being (A-ii),
(B) being (B-i),
(C) an aqueous medium,
(D) a metal chelating agent, and
(E) a surfactant,
wherein the amounts of (A), (B), (D) are—independently from each other—each in the range of from 0.001 wt. % to 0.5 wt. % based on the total weight of composition (Q), and the amount of (E) is in the range of from 0.005 wt. % to 2 wt. % based on the total weight of composition (Q).

According to the preferred embodiment (PE17), the composition (Q) comprises
(A) being (A-i),
(L) an oligomeric or polymeric polycarboxylic acid containing acrylic acid monomeric units, and
(C) an aqueous medium.

According to the preferred embodiment (PE18), the composition (Q) comprises
(A) being (A-i),
(L) an oligomeric or polymeric polycarboxylic acid having at least 20 carboxylic acid groups, and
(C) an aqueous medium.

According to the preferred embodiment (PE19), the composition (Q) comprises
(A) being (A-i),
(L) being (L-i), and
(C) an aqueous medium.

According to the preferred embodiment (PE20), the composition (Q) comprises
(A) being (A-i),
(L) an oligomeric or polymeric polycarboxylic acid which is a maleic acid/acrylic acid copolymer, and
(C) an aqueous medium.

According to the preferred embodiment (PE21), the composition (Q) comprises
(A) thiourea or a derivative thereof,
(L) an oligomeric or polymeric polycarboxylic acid containing acrylic acid monomeric units, and
(C) an aqueous medium.

According to the preferred embodiment (PE22), the composition (Q) comprises
(A) being (A-ii),
(L) an oligomeric or polymeric polycarboxylic acid containing acrylic acid monomeric units, and
(C) an aqueous medium.

According to the preferred embodiment (PE23), the composition (Q) comprises
(A) being (A-ii),
(L) an oligomeric or polymeric polycarboxylic acid having at least 20 carboxylic acid groups, and
(C) an aqueous medium.

According to the preferred embodiment (PE24), the composition (Q) comprises
(A) being (A-ii),
(L) being (L-i), and
(C) an aqueous medium.

According to the preferred embodiment (PE25), the composition (Q) comprises
(A) being (A-ii),
(L) a maleic acid/acrylic acid copolymer, and
(C) an aqueous medium.

According to the preferred embodiment (PE26), the composition (Q) comprises
- (A) being (A-i),
- (L) an oligomeric or polymeric polycarboxylic acid containing acrylic acid monomeric units,
- (C) an aqueous medium, and
- (E) an amphiphilic nonionic surfactant.

According to the preferred embodiment (PE27), the composition (Q) comprises
- (A) being (A-ii),
- (L) an oligomeric or polymeric polycarboxylic acid containing acrylic acid monomeric units,
- (C) an aqueous medium, and
- (E) an amphiphilic nonionic surfactant.

According to the preferred embodiment (PE28), the composition (Q) comprises
- (A) being (A-i),
- (L) being (L-i),
- (C) an aqueous medium, and
- (E) an amphiphilic nonionic surfactant, According to the preferred embodiment (PE29), the composition (Q) comprises
- (A) being (A-ii),
- (L) being (L-i),
- (C) an aqueous medium, and
- (E) an amphiphilic nonionic surfactant.

According to the preferred embodiment (PE30), the composition (Q) comprises
- (A) being (A-i),
- (L) a maleic acid/acrylic acid copolymer,
- (C) an aqueous medium, and
- (E) an amphiphilic nonionic surfactant.

According to the preferred embodiment (PE31), the composition (Q) comprises
- (A) being (A-ii),
- (L) a maleic acid/acrylic acid copolymer,
- (C) an aqueous medium, and
- (E) an amphiphilic nonionic surfactant.

According to the preferred embodiment (PE32), the composition (Q) comprises
- (A) being (A-ii),
- (L) being (L-i),
- (C) an aqueous medium, and
- (E) a water-soluble or water-dispersible amphiphilic nonionic surfactant,
- wherein the amounts of (A) and (L) are—independently from each other—each in the range of from 0.001 wt. % to 0.5 wt. % based on the total weight of composition (Q), and the amount of (E) is in the range of from 0.005 wt. % to 2 wt. % based on the total weight of composition (Q).

The preparation of the composition (Q) does not exhibit any particularities but can be carried out by dissolving or dispersing the above-described ingredients (A) and (B) and optionally (D) and/or (E) and/or other additives in the aqueous medium (C), in particular, in de-ionized water and, most preferably, in ultra-pure water. For this purpose, the customary and standard mixing processes and mixing apparatuses such as agitated vessels, in-line dissolvers, high shear impellers, ultrasonic mixers, homogenizer nozzles or counterflow mixers, can be used.

A large variety of conventional cleaning tools and methods can be used for the process (P) or for the application of the composition (Q) in a post-CMP cleaning step. These cleaning tools include megasonic cleaners, brush cleaners and combinations thereof. Typically, the brushes are made up of soft and porous polyvinyl alcohol materials. The brushes may have different shapes depending on the manufacturer of the processing tool. Most common shapes are rollers, discs and pencils.

After contacting the semiconductor substrates with the composition (Q), the semiconductor substrates are removed from the composition and dried. The drying step can be carried out as described, for example, in the American patent application US 2009/02191873 A1, page 4, paragraph [0022].

The cleaning or removal performance, i.e., the degree of the removal of residues and contaminants, of the composition (Q) and the process (P) can be determined in accordance with various methods. Preferably, the performance is evaluated by comparing untreated semiconductor surfaces with the respective semiconductor surfaces that have been treated with the composition (Q) and the process (P). To this end, scanning electron microscopy (SCM) and/or atomic force microscopy (AFM) can be carried out and the images obtained from the respective treated and the untreated semiconductor surfaces can be compared with each other.

Examples and Comparative Examples

Ludox® TM50 is colloidal silica in form of a 50 wt. % suspension in $H_2O$ and is obtained from Sigma-Aldrich.

Lutensol® XP80 is a branched amphiphilic nonionic surfactant provided by BASF SE. It is alkyl polyethylene glycol ether based on $C_{10}$-Guerbet alcohol and ethylene oxide.

Sokalan® CP 12 S is a polymeric polycarboxylic acid provided by BASF SE. It is a maleic acid/acrylic acid copolymer.

"Dip tests" were conducted using electrochemical plating copper coupon. In the following procedure, the silica slurry was composed of 0.5 wt. % Ludox® TM50 at pH 4. A sample coupon was first dipped into 0.02 wt. % $HNO_3$ for 35 s, rinsed by deionized water, and thereafter dipped into silica slurry for 5 min, then rinsed by deionized water for 15 s. Each coupon was then dipped into the subject surfactant solution for 2 min, rinsed by deionized water for 15 s. The coupons were hung to air dry under ambient conditions. Dried coupons were evaluated by scanning electron microscopy (SEM) for evidence of remaining silica abrasive. The dried coupons were compared.

SEM images were recorded using JEOL 7400 High resolution field emission Scanning Electron Microscope at an accelerating potential of 15 kV and magnification of 50,000.

The pH value is measured with a pH electrode (Schott, blue line, pH 0-14/−5 . . . 100° C./3 mol/L sodium chloride).

Contact Angle Measurements

The contact angle for deionized water (deionized water is referred to as "DIW" in the following) on treated and untreated copper wafer surface was determined. The electrochemical plating copper wafer copper surface without any treatment has a DIW contact angle of approximately 80°, implying that there was organic residues adsorption on copper surface. Copper coupon was immersed in 0.02 wt. % $HNO_3$ for 35 s and rinsed with DIW to get fresh surface. The fresh copper surface has a DIW contact angle of approximately 50°, indicating that the surface was relative hydrophilic. Then the copper coupon with $HNO_3$ pre-treatment was immersed in 0.2 wt. % benzotriazole solution (benzotriazole is referred to as "BTA" in the following) for 5 min, rinsed by DIW and compressed air drying. The Cu-BTA surface has a DIW contact angle of approximately 89°, indicating that the surface was relative hydrophobic (i.e., non-wetting). The Cu-BTA surface was dipped in a variety of compositions as listed in table A for 5 min, rinsed with DIW for 15 s and followed by compressed air drying for 1 min, thereafter the contact angle of DIW was determined immediately. For comparison, the contact angle of DIW on fresh copper surface treated with the same composition was also determined. The surfaces examined are summarized below in Table A.

TABLE A

| Cleaning solution no. | Composition of the cleaning solutions (aqueous medium = deionized water) | Contact angle (°) | |
|---|---|---|---|
| | | Cu-BTA surface after immersion in composition | Fresh Cu surface after immersion in composition |
| S21 | 0.04 wt. % Citric acid pH 6 | 64 | 41 |
| S22 | 0.04 wt. % L-serine pH 6 | 75 | 46.5 |
| S23 | 0.04 wt. % L-cysteine pH 6 | 34 | 32 |
| S24 | 0.04 wt. % N-acetylcysteine pH 6 | 43 | 43 |
| S25 | 0.04 wt. % Urea pH 6 | 67 | 38 |
| S26 | 0.04 wt. % Thiourea pH 6 | 63 | 66 |

It can be seen that the Cu-BTA surfaces treated with citric acid, serine, urea have a contact angle of approximately 64°, 75°, 67°, respectively, indicating that the treated surfaces were still relative hydrophobic. In contrast, fresh Cu surface treated with citric acid, serine, urea have contact angle of 41°, 46°, 38°, respectively, implying that the treated surfaces were hydrophilic. However, both Cu-BTA surface and fresh Cu surface treated with cysteine have DIW contact angle of approximate 34° and 32°. Interestingly, acetyl-cysteine treated Cu-BTA surface has a DIW contact angle of 43°, which is the same with acetyl-cysteine treated fresh copper surface. Similarly, thiourea treated Cu-BTA surface has a DIW contact angle of approximately 63°, which is close to DIW contact angle on thiourea treated fresh copper surface. The results illustrate that after treated with compositions containing a compound comprising at least one thiol, thio-ether or thiocarbonyl group, Cu-BTA and fresh copper surface would have almost the same DIW contact angles.

Tafel Plot Measurements of the Cleaning Efficiency of BTA Film on Copper Surface The cleaning efficiency of BTA film on Cu surface was evaluated by Tafel plot measurement. Fresh Cu wafer coupon was immersed in 0.2% BTA solution having a natural pH 5.8 for 15 min, rinsed by DIW and followed by compressed air drying. As working electrode, relative to Ag/AgCl reference electrode, the BTA treated copper coupon was immersed in a variety of compositions for measurement. For comparison, fresh copper coupon was also dipped in the variety of compositions for measurement. The corrosion potential and corrosion current of substrates in different solutions are summarized below in Table B.

TABLE B

| Substrate | Solution | $E_{corr}$ [V] | $I_{corr}$ [µA/cm$^2$] |
|---|---|---|---|
| Cu | DIW pH 6 | 0.02 | 0.45 |
| Cu-BTA | DIW pH 6 | 0.025 | 0.018 |
| Cu | 0.04 wt. % citric acid pH 6, in DIW | −0.108 | 25 |
| Cu-BTA | 0.04 wt. % Citric acid pH 6, in DIW | −0.055 | 0.54 |
| Cu | 0.04 wt. % serine pH 6, in DIW | −0.233 | 7.5 |
| Cu-BTA | 0.04 wt. % serine pH 6, in DIW | 0.04 | 0.082 |
| Cu | 0.04 wt. % N-acetylcysteine pH 6, in DIW | −0.248 | 0.89 |
| Cu-BTA | 0.04 wt. % N-acetylcysteine pH 6, in DIW | −0.223 | 0.91 |
| Cu | 0.04 wt. % cysteine pH 6, in DIW | −0.257 | 1.7 |
| Cu-BTA | 0.04 wt. % cysteine pH 6, in DIW | −0.223 | 1.51 |
| Cu | 0.04 wt. % thiourea pH 6, in DIW | −0.38 | 2.78 |
| Cu-BTA | 0.04 wt. % thiourea pH 6, in DIW | −0.367 | 2.76 |

It can be seen that the corrosion current of copper treated with 0.2 wt. % BTA in DIW pH 6 is 0.018 µA/cm$^2$, which is much lower than the corrosion current of fresh copper in the same solution, indicating that the high passivation efficiency of BTA film on Cu surface. As chelating agent, the corrosion current of fresh copper in citric acid and serine is much higher than corrosion current of copper in blank solution (DIW pH 6). However, the corrosion current of Cu-BTA surface in citric acid and serine is lower than the corrosion current of Cu surface in the same solution, but relative higher than the Cu-BTA surface in blank solution. Meanwhile, the corrosion potential of Cu-BTA is higher than Cu surface, implying that the citric acid and serine could remove some amount of BTA layer but BTA film was still on copper surface. In contrast, corrosion current of Cu-BTA in acetyl-cysteine, cysteine, and thiourea solution were almost identical to the corrosion current of Cu surface in the same solution, indicating that Cu-BTA film was removed by the solutions completely. In another aspect, the BTA removal efficiency may be predicted simply by measuring corrosion potential and corrosion current of Cu-BTA and Cu surface.

XPS Measurements of the Cleaning Efficiency of BTA Film on Copper Surface

The efficiency of formulations for BTA removal on Cu substrate was evaluated. The wafer coupon was pre-treated with 0.02 wt. % HNO$_3$ for 35 sec, rinsed with DIW and followed by compressed air drying. Then the coupon was dipped in 0.2 wt. % BTA solution for 5 min, followed by DIW rinse and compress air drying. After that, the BTA treated copper coupon was dipped in a variety of formulations at pH 6 for 5 min, rinsed with DIW and followed by compress air drying. BTA treatment and an untreated sample were analyzed for comparison. Analysis was done using X-ray photoelectron spectroscopy (XPS) at angles of 55°. Table C includes BTA removal results in different composition solutions relative to the BTA and untreated sample.

TABLE C

|  | Copper at % | Nitrogen at % | Nitrogen to copper ratio | Cleaning efficiency |
|---|---|---|---|---|
| Untreated | 100 | — | — | — |
| BTA | 31.16 | 68.84 | 2.21 | — |
| 0.04 wt. % N-acetylcysteine | 81.89 | 18.11 | 0.22 | 90% |
| 0.04% cysteine | 87.80 | 12.20 | 0.14 | 94% |
| 0.04% serine | 52.55 | 47.45 | 0.90 | 0.59% |
| 0.04% thiourea | 94.21 | 5.79 | 0.06 | 97% |
| 0.04% urea | 35.53 | 64.47 | 1.82 | 17.6% |
| 0.04% citric acid | 37.96 | 62.04 | 1.63 | 0.26% |

The nitrogen to copper ratio indicates the amount of BTA remaining on the copper surface. As expected, the citric acid and serine could remove some layer of BTA, but still left BTA on the wafer surface. In contrast, compounds comprising at least one thiol, thioether or thiocarbonyl group (for example acetyl-cysteine, cysteine, and thiourea) have high BTA removal efficiency.

Dip Test Series No. 1

Tests were conducted to evaluate the relative cleaning performance of different formulations as listed in table D. Copper coupon was dipped in 0.02 wt. % HNO$_3$ for 35 s, rinsed with DIW and followed by compress air drying. The coupon was dipped in 0.2 wt. % BTA for 5 min, rinsed with DIW, thereafter the Cu-BTA surface was immersed in 0.5 wt. % Ludox® TM 50 pH 4 for 5 min. After that, the coupon was immersed in the cleaning compositions for 2 min, followed by DIW rinse and air drying. Control sample Z was a coupon which was dipped in 0.2 wt. % BTA for 5 min, rinsed with DIW, thereafter the Cu-BTA surface of this coupon was immersed in 0.5 wt. % Ludox® TM 50 pH 4 for 5 min. Control sample Z was not subjected to any cleaning treatment. The SEM analysis results are summarized in FIG. 1.

The results in FIG. 1 show that the copper surface cleaned without a compound comprising at least one thiol, thioether or thiocarbonyl group still had a substantial number of silica particles on surface, possibly due to the presence of adsorbed BTA on Cu surface. In contrast, when the copper was cleaned with a composition containing a compound comprising at least one thiol, thioether or thiocarbonyl group (for example cysteine or N-acetylcysteine), the number of silica particles decreased dramatically.

TABLE D

| Cleaning composition no. [(*) = comparative example] | Formulation of the cleaning compositions (aqueous medium = deionized water) | pH |
|---|---|---|
| S31 (*) | 0.05 wt. % citric acid + 0.2 wt. % Lutensol ® XP80 + 0.05 wt. % erythritol | 6 |
| S32 | 0.05 wt. % citric acid + 0.2 wt. % Lutensol ® XP80 + 0.05 wt. % erythritol + 0.04 wt. % N-acetylcysteine | 6 |
| S33 | 0.05 wt. % citric acid + 0.2 wt. % Lutensol ® XP80 + 0.05 wt. % erythritol + 0.04 wt. % cysteine | 6 |
| S34 (*) | 0.05 wt. % citric acid + 0.2 wt. % Lutensol ® XP80 + 0.05 wt. % erythritol + 0.04 wt. % serine | 6 |

The cleaning compositions S32 and S33 show an improved cleaning performance.

Dip Test Series No. 2

Tests were conducted to evaluate the cleaning performance of various cleaning compositions at different pH condition. These test compositions were prepared as set forth in Table E. All the compositions were adjusted by diluted KOH or HNO$_3$. The prepared cleaning compositions were evaluated using electrochemical plating copper wafer according to the following procedure. The wafer was polished by barrier slurry containing silica particles, H$_2$O$_2$, BTA. Thereafter, the polished wafer was cut into coupons. Copper coupons were dipped into cleaning compositions for 5 min and then rinsed by DI water for 15 s followed by compress air drying for 1 min. Dried coupons were evaluated by scanning electron microscopy (SEM) for evidence of remaining silica abrasive and BTA passivation layers. For comparison, the polished coupon without cleaning treatment was evaluated by SEM as well (control sample Y). The results were shown in FIGS. 2 and 3.

The results in FIGS. 2 and 3 indicate that the silica particles were removed completely when the copper surfaces were cleaned by the cleaning compositions containing a compound comprising at least one thiol, thioether or thiocarbonyl group (for example N-acetylcysteine). In contrast, the silica particles were hardly cleaned by cleaning compositions which do not contain such a compound. The results show that there are BTA passivation layers on the top of copper surface after the barrier CMP process, which would suppress the silica particles removal during cleaning process. Also, the results demonstrate that the compositions containing a compound comprising at least one thiol, thioether or thiocarbonyl group (for example N-acetylcysteine) have good performance at pH 3, 6 and 10.5. Therefore, the post-CMP cleaning compositions of the invention are suited for application in acidic, neutral and alkaline conditions.

TABLE E

| Cleaning composition no. [(*) = comparative example] | Formulation of the cleaning compositions (aqueous medium = deionized water) | pH |
|---|---|---|
| S35 | 0.05 wt. % Sokalan ® CP 12 S + | 3 |
| S36 | 0.2 wt. % Lutensol ® XP80 + 0.05 wt. % | 6 |
| S37 | erythritol + 0.04 wt. % N-acetylcysteine | 10.5 |
| S38 (*) | 0.05 wt. % Sokalan ® CP 12 S + | 3 |
| S39 (*) | 0.2 wt. % Lutensol ® XP80 | 6 |
| S40 (*) |  | 10.5 |
| S41 (*) | 0.05 wt. % Sokalan ® CP 12 S + | 3 |
| S42 (*) | 0.2 wt. % Lutensol ® XP80 + | 6 |
| S43 (*) | 0.05 wt. % erythritol | 10.5 |
| S44 | 0.05 wt. % Sokalan ® CP 12 S + | 3 |
| S45 | 0.2 wt. % Lutensol ® XP80 + | 6 |
| S46 | 0.04 wt. % N-acetylcysteine | 10.5 |

The cleaning compositions S35, S36, S37, S44, S45 and S46 show an improved cleaning performance.

Figure 1:
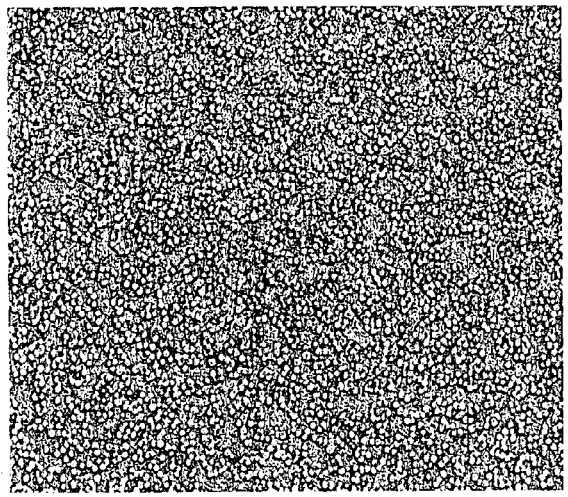
FIG. 1 shows the SEM analysis results of the dip test series no. 1 using the cleaning compositions S31, S32, S33, S34 as well as the SEM analysis results of control sample Z.
Figure 1:
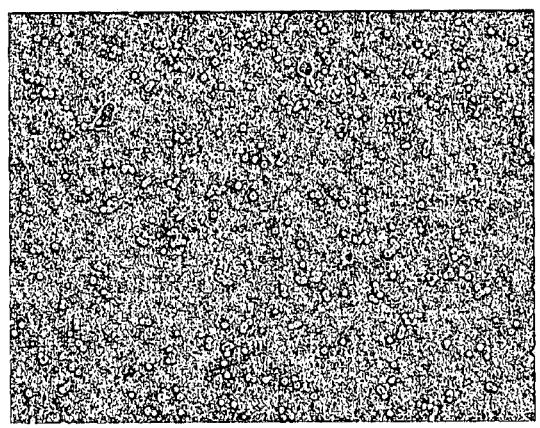
Figure 1:
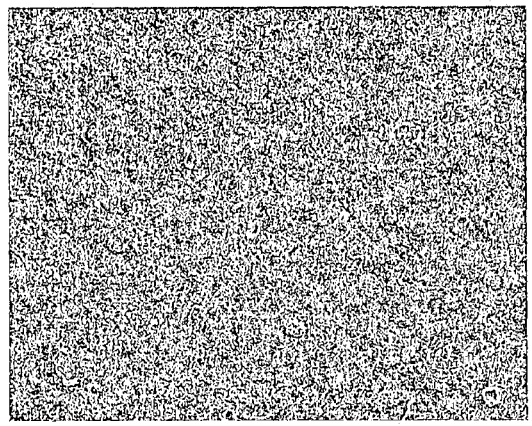
Figure 1:
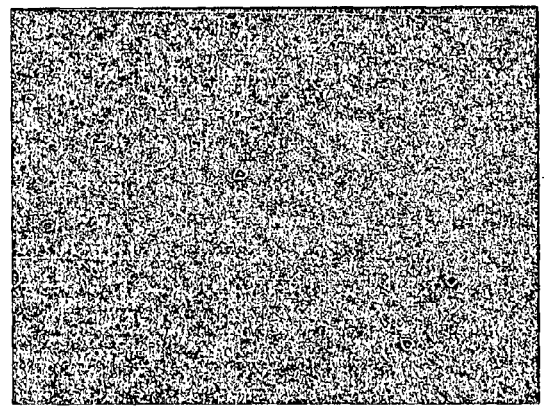
Figure 1:
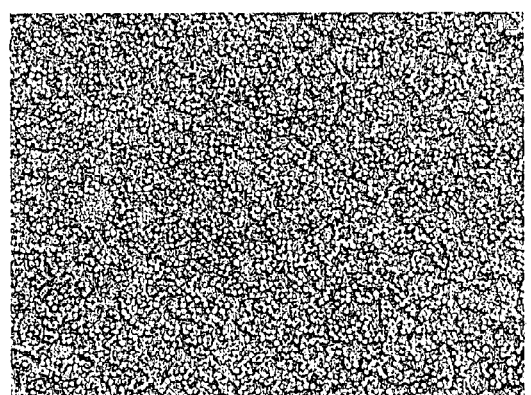
Figure 2:
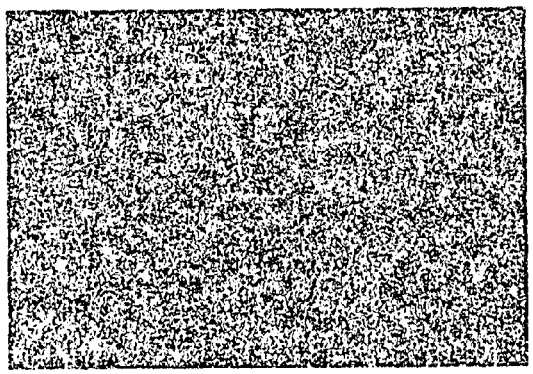
FIG. 2 shows the SEM analysis results of the dip test series no. 2 using the cleaning compositions S35, S36, S37, S38, S39, S40 as well as the SEM analysis results of control sample Y.
Figure 2:
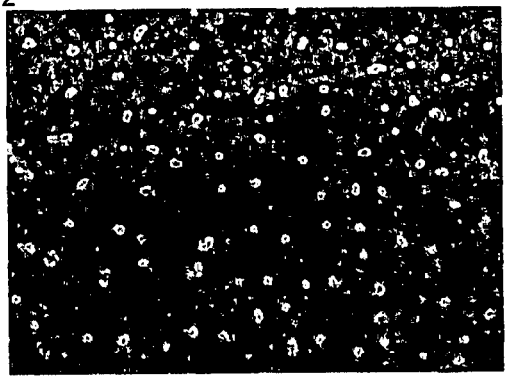
Figure 2:
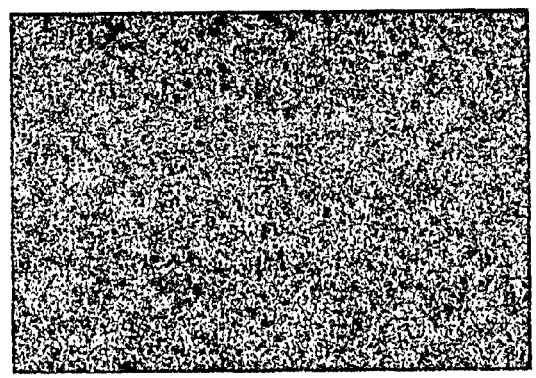
Figure 2:
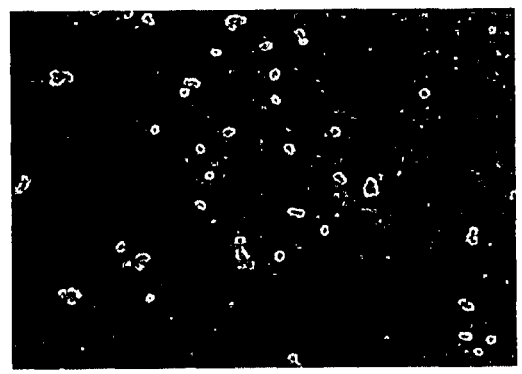
Figure 2:
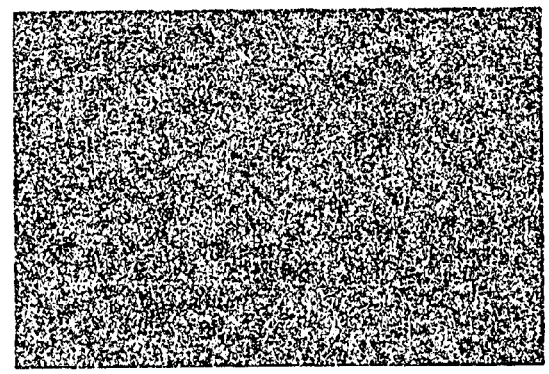
Figure 2:
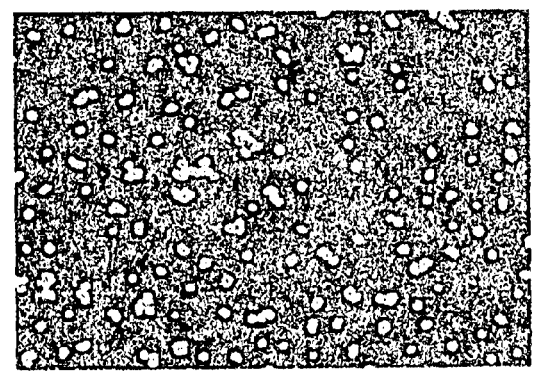
Figure 2:
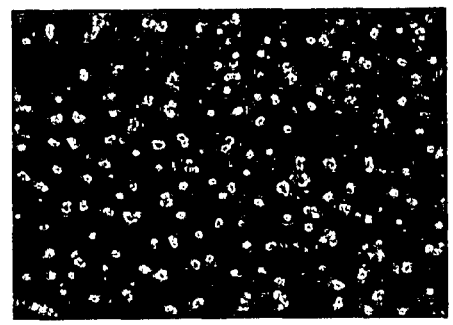
Figure 3:
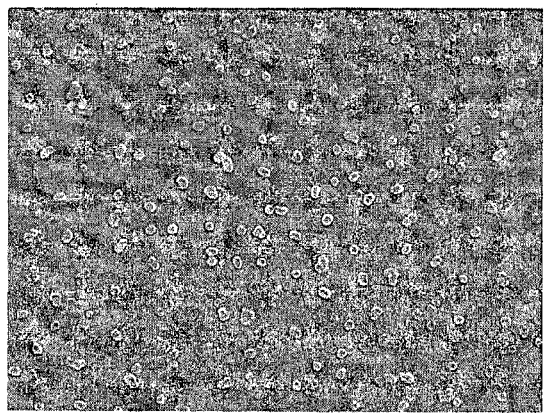
FIG. 3 shows the SEM analysis results of the dip test series no. 2 using the cleaning compositions S41, S42, S43, S44, S45, and S46.
Figure 3:
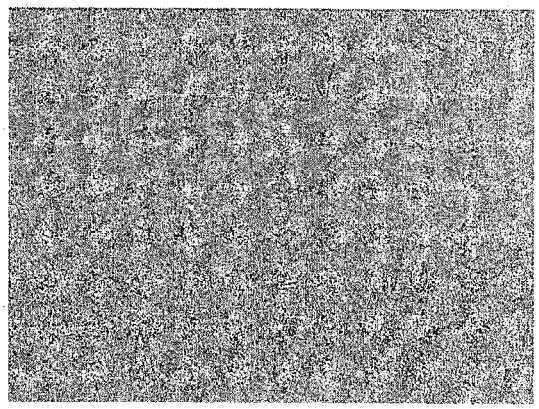
Figure 3:
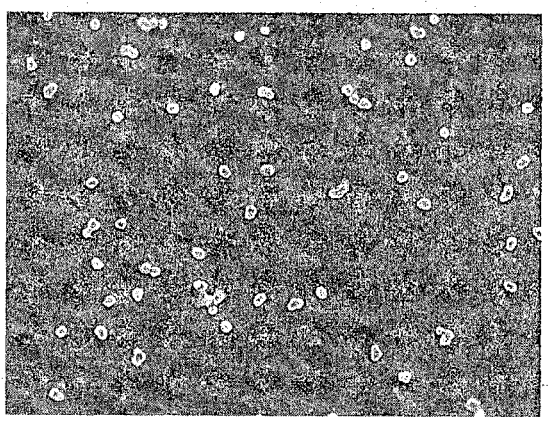
Figure 3:
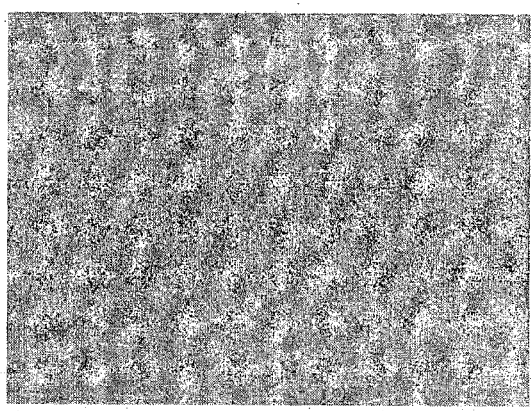
Figure 3:
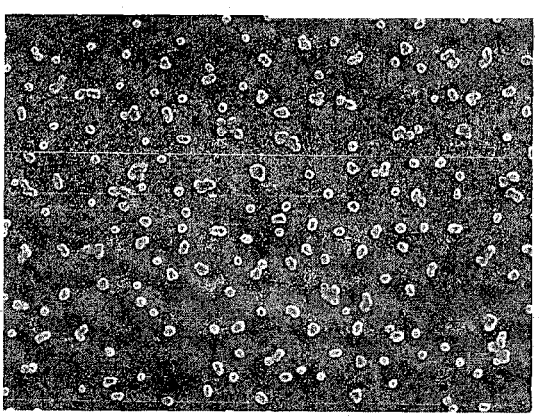
Figure 3:
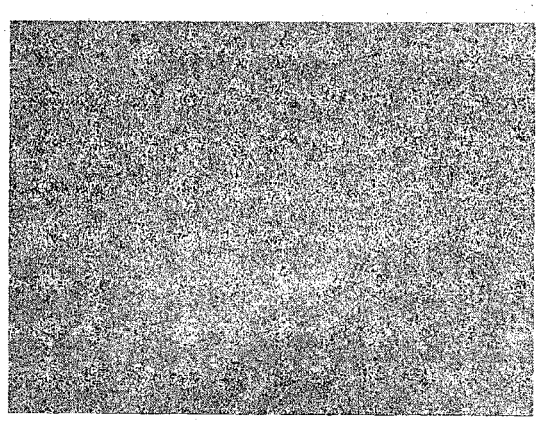

The invention claimed is:

1. A post chemical-mechanical-polishing (post-CMP) cleaning composition, comprising:
   (A) at least one compound comprising at least one thiol (—SH), thioether —($SR^1$) or thiocarbonyl (>C=S) group, wherein $R^1$ is alkyl, aryl, alkylaryl or arylalkyl,
   (B) erythritol, threitol, a stereoisomer thereof, or a mixture thereof, and
   (C) an aqueous medium; and
   (E) at least one surfactant.

2. The composition according to claim 1, wherein the compound (A) further comprises at least one amino (—$NH_2$, —$NHR^2$, or —$NR^3R^4$) group, and wherein $R^1$, $R^2$, $R^3$ and $R^4$ are, independently from each other, alkyl, aryl, alkylaryl, or arylalkyl.

3. The composition according to claim 2, wherein the compound (A) is thiourea or a derivative thereof.

4. The composition according to claim 2, wherein compound (A) is an amino acid comprising at least one thiol (—SH), thioether (—$SR^1$) group, or a derivative thereof, wherein $R^1$ is alkyl, aryl, alkylaryl or arylalkyl.

5. The composition according to claim 4, wherein the compound (A) is cysteine, cystine, glutathione, N-acetylcysteine, or a derivative thereof.

6. The composition according to claim 1, wherein the composition further comprises
   (D) at least one metal chelating agent.

7. The composition according to claim 6, wherein at least one metal chelating agent (D) s selected from the group consisting of propane-1,2,3-tricarboxylic acid, citric acid, butane-1,2,3,4-tetracarboxylic acid, pentane-1,2,3,4,5-pentacarboxylic acid, trimellitic acid, trimesinic acid, pyromellitic acid, mellitic acid and oligomeric and polymeric polycarboxylic acids.

8. The composition according to claim 1, wherein at least one surfactant (E) is selected from the group consisting of:
   (E1) amphiphilic nonionic, water-soluble or water-dispersible surfactants comprising
      (e11) at least one hydrophobic group selected from the group consisting of branched alkyl groups having 5 to 20 carbon atoms; and
      (e12) at least one hydrophilic group consisting of oxyethylene monomer units;
   (E2) amphiphilic nonionic, water-soluble or water-dispersible surfactants comprising
      (e21) at least one hydrophobic group selected from the group consisting of branched alkyl groups having 5 to 20 carbon atoms; and
      (e22) at least one hydrophilic group selected from the group consisting polyoxyalkylene groups comprising
         (e221) oxyethylene monomer units and
         (e222) at least one type of substituted oxyalkylene monomer units wherein the substituents are selected from the group consisting of alkyl, cycloalkyl, aryl, alkyl-cycloalkyl, alkyl-aryl, cycloalkyl-aryl and alkyl-cycloalkyl-aryl groups; and
      said polyoxyalkylene group of (e22) containing the monomer units (e221) and (e222) in random, alternating, gradient and/or blocklike distribution; and
   (E3) amphiphilic nonionic, water-soluble or water-dispersible alkyl polyglucoside surfactants.

9. A method for removing residues and contaminants from the surface of a semiconductor substrate useful for manufacturing microelectronic devices, said method comprising contacting said substrate with the post-CMP cleaning composition of claim 1.

10. The method according to claim 9, wherein the post-CMP cleaning composition has a pH value of from 4 to 8.

11. The method according to claim 9, wherein the residues and contaminants comprise benzotriazole or a derivative thereof and wherein the surface is a copper-containing surface.

12. The method according to claim 9, wherein the semiconductor substrate comprises
   electrically conductive layers comprises copper,
   electrically insulating dielectric layers comprising low-k or ultra-lox dielectric materials, and
   barrier layers comprising tantalum, tantalum nitride, titanium nitride, cobalt, nickel, manganese, ruthenium, ruthenium-nitride, ruthenium-carbide, or ruthenium tungsten nitride.

13. A method for manufacturing microelectronic devices from semiconductor substrates, said method comprising contacting the semiconductor substrate with the post-CMP cleaning composition of claim 1 to remove residues and contaminants from the surface of the substrate.

14. The method according to claim 13, wherein the cleaning composition has a pH value of from 4 to 8.

15. The method according to claim 13, wherein the residues and contaminants comprise benzotriazole or a derivative thereof and wherein the surface is a copper-containing surface.

16. The method according to claim 13, wherein the semiconductor substrate comprises
   electrically conductive layers comprising copper,
   electrically insulating dielectric layers comprising low-k or ultra-low-k dielectric materials, and
   barrier layers comprising tantalum, tantalum nitride, titanium nitride, cobalt, nickel, manganese, ruthenium, ruthenium-nitride, ruthenium-carbide, or ruthenium tungsten nitride.

17. A post chemical-mechanical-polishing (post-CMP) cleaning composition, comprising:
   (A) cysteine, glutathione, N-acetylcysteine, thiourea or a derivative thereof
   (L) at least one oligomeric or polymeric polycarboxylic acid, and
   (C) an aqueous medium,
   wherein (L) is an oligomeric or polymeric polycarboxylic acid comprising acrylic acid monomeric units.

18. A post chemical-mechanical-polishing (post-CMP) cleaning composition, comprising:
   (A) cysteine, glutathione, N-acetylcysteine, thiourea or a derivative thereof
   (L) at least one oligomeric or polymeric polycarboxylic acid, and
   (C) an aqueous medium, wherein (L) is an oligomeric or polymeric polycarboxylic acid having at least 20 carboxylic acid groups.

19. A post chemical-mechanical-polishing (post-CMP) cleaning composition, comprising:
   (A) cysteine, glutathione, N-acetylcysteine, thiourea or a derivative thereof
   (L) at least one oligomeric or polymeric polycarboxylic acid, and
   (C) an aqueous medium,
   wherein the weight average molecular weight of the oligomeric or polymeric polycarboxylic acid (L) is more than 2,000 Dalton as determined by gel permeation chromatography.

20. A post chemical-mechanical-polishing (post-CMP) cleaning composition, comprising:
   (A) cysteine, glutathione, N-acetylcysteine, thiourea or a derivative thereof
   (L) at least one oligomeric or polymeric polycarboxylic acid, and
   (C) an aqueous medium,
   wherein (L) is an oligomeric or polymeric polycarboxylic acid which is a copolymer comprising
   (i) acrylic acid monomeric units, and
   (ii) monomeric units derived from fumaric acid, maleic acid, itaconic acid, aconitic acid, mesaconic acid, citraconic acid, methylenemalonic acid or maleic anhydride.

21. A post chemical-mechanical-polishing (post-CMP) cleaning composition, comprising:
   (A) cysteine, glutathione, N-acetylcysteine, thiourea or a derivative thereof
   (L) at least one oligomeric or polymeric polycarboxylic acid, and
   (C) an aqueous medium,
   wherein (L) is an oligomeric or polymeric polycarboxylic acid which is a maleic acid/acrylic acid copolymer.

22. A post chemical-mechanical-polishing (post-CMP) cleaning composition, comprising:
   (A) cysteine, glutathione, N-acetylcysteine, thiourea or a derivative thereof
   (L) at least one oligomeric or polymeric polycarboxylic acid,
   (C) an aqueous medium, and
   (E) at least one surfactant (E) selected from the group consisting of:
      (E1) amphiphilic nonionic, water-soluble or water-dispersible surfactants comprising
         (e11) at least one hydrophobic group selected from the group consisting of branched alkyl groups having 5 to 20 carbon atoms; and
         (e12) at least one hydrophilic group consisting of oxyethylene monomer units;
      (E2) amphiphilic nonionic, water-soluble or water-dispersible surfactants comprising
         at least one hydrophobic group selected from the group consisting of branched alkyl groups having 5 to 20 carbon atoms; and
         (e22) at least one hydrophilic group selected from the group consisting of polyoxyalkylene groups comprising
         (e221) oxyethylene monomer units and
         (e222) at least one type of substituted oxyalkylene monomer units wherein the substituents are selected from the group consisting of alkyl, cycloalkyl, aryl, alkyl-cycloalkyl, alkyl-aryl, cycloalkyl-aryl and alkyl-cycloalkyl-aryl groups; and
         said polyoxyalkylene group of (e22) containing the monomer units (e221) and (e222) in random, alternating, gradient and/or blocklike distribution; and
      (E3) amphiphilic nonionic, water-soluble or water-dispersible alkyl poly glucoside surfactants.

23. A method for removing residues and contaminants from the surface of a semiconductor substrate useful for manufacturing microelectronic devices said method comprising
   contacting said substrate with a post-CMP cleaning composition,
   wherein the residues and contaminants comprise benzotriazole or a derivative thereof and wherein the surface is a copper-containing surface, and
   wherein said post chemical-mechanical-polishing (post-CMP) cleaning composition comprises:
   (A) cysteine, glutathione, N-acetylcysteine, thiourea or a derivative thereof
   (L) at least one oligomeric or polymeric polycarboxylic acid, and
   (C) an aqueous medium.

24. A method for removing residues and contaminants from the surface of a semiconductor substrate useful for manufacturing microelectronic devices, said method comprising
   contacting said substrate with a post-CMP cleaning composition,
   wherein the semiconductor substrate comprises
      electrically conductive layers comprising of copper,
      electrically insulating dielectric layers comprising low-k or ultra-low-k dielectric materials, and
      barrier layers comprising tantalum, tantalum nitride, titanium nitride, cobalt, nickel, manganese, ruthenium, ruthenium-nitride, ruthenium-carbide, or ruthenium tungsten nitride; and
   wherein said post chemical-mechanical-polishing (post-CMP) cleaning composition comprises:
   (A) cysteine, glutathione, N-acetylcysteine, thiourea or a derivative thereof
   (L) at least one oligomeric or polymeric polycarboxylic acid, and
   (C) an aqueous medium.

25. A method for manufacturing microelectronic devices from semiconductor substrates, said method comprising
   contacting the semiconductor substrate with a post-CMP cleaning composition to remove residues and contaminants from the surface of the substrate, wherein said post chemical-mechanical-polishing (post-CMP) cleaning composition comprises:
   (A) cysteine, glutathione, N-acetylcysteine, thiourea or a derivative thereof
   (L) at least one oligomeric or polymeric polycarboxylic acid, and
   (C) an aqueous medium.

26. The method according to claim 25, wherein the residues and contaminants comprise benzotriazole or a derivative thereof and wherein the surface is a copper-containing surface.

27. The method according to claim 25, wherein the semiconductor substrate comprises
   electrically conductive layers comprising copper,
   electrically insulating dielectric layers comprising low-k or ultra-low-k dielectric materials, and barrier layers comprising tantalum, tantalum nitride, titanium nitride, cobalt, nickel, manganese, ruthenium, ruthenium-nitride, ruthenium-carbide, or ruthenium tungsten nitride.

28. A post chemical-mechanical-polishing (post-CMP) cleaning composition comprising:
(A) at least one compound comprising at least one thiol (—SH), thioether (—SR$^1$) or thiocarbonyl (>C=S) group, wherein R$^1$ is alkyl, aryl, alkylaryl arylalkyl,
(B) erythritol, threitol, a stereoisomer thereof, or a mixture thereof, and
(C) an aqueous medium, wherein the composition has a pH of from 4 to 8.

29. A post chemical-mechanical-polishing (post-CMP) cleaning composition, comprising:
(A) cysteine, glutathione, N-acetylcysteine, thiourea or a derivative thereof
(L) at least one oligomeric or polymeric polycarboxylic acid, and
(C) an aqueous medium, wherein the composition has a pH of from 4 to 8.

30. The method according to claim 9 further comprising chemical polishing the substrate before contacting said substrate with the post-CMP cleaning composition.

31. The method according to claim 23 further comprising chemical polishing the substrate before contacting said substrate with the post-CMP cleaning composition.

32. The method according to claim 24 further comprising chemical polishing the substrate before contacting said substrate with the post-CMP cleaning composition.

* * * * *